United States Patent
Terunuma et al.

(10) Patent No.: US 6,462,917 B2
(45) Date of Patent: Oct. 8, 2002

(54) MAGNETORESISTIVE SENSOR, A THIN FILM MAGNETIC HEAD, A MAGNETIC HEAD DEVICE, AND A MAGNETIC DISK DRIVE DEVICE

(75) Inventors: Koichi Terunuma; Tetsuro Sasaki; Kosuke Tanaka; Takumi Uesugi, all of Chuo-Ku (JP)

(73) Assignee: TDK Corporation, Tokyo (JP)

( * ) Notice: Subject to any disclaimer, the term of this patent is extended or adjusted under 35 U.S.C. 154(b) by 92 days.

(21) Appl. No.: 09/772,930

(22) Filed: Jan. 31, 2001

(65) Prior Publication Data

US 2001/0024346 A1 Sep. 27, 2001

(30) Foreign Application Priority Data

Feb. 17, 2000 (JP) ........................................ 2000-040339

(51) Int. Cl.[7] .............................. G11B 5/39; G11B 5/66
(52) U.S. Cl. .............................. 360/324.1; 428/694 TR
(58) Field of Search .................. 360/324.1; 324/207.21, 324/252; 338/32 R; 428/680, 692, 694 TR, 694 TM

(56) References Cited

U.S. PATENT DOCUMENTS 5,206,590 A   4/1993  Dieny et al.
5,948,550 A * 9/1999  Fujii et al. .................. 428/611

OTHER PUBLICATIONS

IEEE Transactions on Magnetics, vol. 30, No. 6, Nov. 1994, Tsang et al., "Design, Fabrication & Testing of Spin–Valve Read Heads for High Density Recording".

* cited by examiner

Primary Examiner—George J. Letscher
(74) Attorney, Agent, or Firm—Oliff & Berridge, PLC

(57) ABSTRACT

A magnetoresistive sensor according to the present invention has a spin-valve film structure which includes an underfilm, a first ferromagnetic film, a conductive film, a second ferromagnetic film, an antiferromagnetic film and a protective film. One surface of the first ferromagnetic film is adjacent to the one surface of the underfilm, and the one surface of the conductive film is adjacent to the other surface of the first ferromagnetic film. One surface of the second ferromagnetic film is adjacent to the other surface of the conductive film. One surface of the antiferromagnetic film adjacent to the other surface of the second ferromagnetic film, and thus, the antiferromagnetic film is bonded to the second ferromagnetic film with exchange interaction. One surface of the protective film is adjacent to the other surface of the antiferromagnetic film. The underfilm has a face centered cubic crystal structure, and is oriented in the (111) plane direction. Then, the distance between the adjacent (111) planes of the spin-valve film structure except the antiferromagnetic film is within 0.2050–0.2064 nm.

24 Claims, 8 Drawing Sheets

MAGNETORESISTIVE SENSOR, A THIN FILM MAGNETIC HEAD, A MAGNETIC HEAD DEVICE, AND A MAGNETIC DISK DRIVE DEVICE

BACKGROUND OF THE INVENTION

1) Field of the Invention

This invention relates to a magnetoresistive sensor, a thin film magnetic head, a magnetic head device, and a magnetic disk drive device.

2) Related Art Statement

With recent downsizing of a magnetic disk drive device, a thin film magnetic head having a magnetoresistive sensor which takes advantage of its magnetoresistive effect, has been employed as a magnetic converter suitable for reading data recorded in a magnetic recording medium in a high recording density because its output is not influenced by the relative velocity for the magnetic recording medium.

Conventionally, a reading element with an anisotropic magnetoresistive effective film (hereinafter, called as an "AMR film") made of permalloy or the like is employed as the above magnetic converter, but recently, a reading element with a giant magnetoresistive effective film (hereinafter, called as a "GMR film"), particularly a spin-valve film structure is mainly used. A magnetoresistive sensor with the spin-valve film structure is disclosed in Japanese Nonexamined Patent Publication Kokai Hei 4-358301 and "IEEE TRANSACTION ON MAGNETICS, Vol. 30, No. 6", November, 1994. The spin-valve film structure has an underfilm, a first ferromagnetic film (free layer), a conductive film, an anti-ferromagnetic film and a second ferromagnetic film.

The first ferromagnetic film is made of a metallic film or an alloy film which have their respective face centered cubic crystal structure, and concretely, made of a stacked film composed of a NiFe film and a CoFe film.

The underfilm is made of the material which is selected in light of obtaining a high magnetoresistive effective converting ratio (hereinafter, called as a "MR converting ratio") through its large (111) plane orientation, small diffusion for the first ferromagnetic film, and its large corrosion resistance. Concretely, in the case of making the first ferromagnetic film of the above stacked film, the underfilm is preferably made of a metallic film such as a Ta film, a Nb film, a Zr film and a Hf film.

The second ferromagnetic film is stacked on and bonded to the antiferromagnetic film with exchange interaction, and thus, its magnetization is pinned in one direction. In this specification, the pinned second ferromagnetic film is often called as a "pinned layer". The conductive film is formed between the first and the second ferromagnetic films.

When an external magnetic field is applied to the spin-valve film structure, the magnetization of the first ferromagnetic film is rotated by the external magnetic field. The resistance of the spin-valve film structure is determined by the relative angle of the magnetization of the first ferromagnetic film for the magnetization of the second ferromagnetic film. The spin-valve film structure has its maximum resistance when the magnetization direction of the first ferromagnetic film is opposite to that of the second ferromagnetic film, and has its minimum resistance when the magnetization direction of the first ferromagnetic film is the same as that of the second ferromagnetic film. Then, the external magnetic field is detected from the resistance change.

However, when the underfilm is made of the above Ta film, Nb film, Zr film, Hf film or the like, a large MR converting ratio can not be realized in spite of the above appropriate material selection for the first ferromagnetic film. Concretely, the spin-valve film structure having a Ta underfilm and a NiFe/CoFe stacking first ferromagnetic film has only 7–8% MR converting ratio.

SUMMARY OF THE INVENTION

It is an object of the present invention to provide a magnetoresistive sensor capable of realizing a MR converting ratio of 10% or over.

It is another object of the present invention to provide a thin film magnetic head, a magnetic head device and a magnetic disk drive device having the above magnetoresistive sensor.

For solving the above matter, a magnetoresistive sensor according to the present invention has a spin-valve film structure which includes an underfilm, a first ferromagnetic film, a conductive film, a second ferromagnetic film, an antiferromagnetic film and a protective film.

One surface of the first ferromagnetic film is adjacent to the one surface of the underfilm, and the one surface of the conductive film is adjacent to the other surface of the first ferromagnetic film. One surface of the second ferromagnetic film is adjacent to the other surface of the conductive film. One surface of the antiferromagnetic film adjacent to the other surface of the second ferromagnetic film, and thus, the antiferromagnetic film is bonded to the second ferromagnetic film with exchange interaction. One surface of the protective film is adjacent to the other surface of the antiferromagnetic film. That is, the underfilm, the first ferromagnetic film, the conductive film, the second ferromagnetic film, the antiferromagnetic film and the protective film are stacked in turn.

In the above magnetoresistive sensor of the present invention, the second ferromagnetic film is adjacent to the antiferromagnetic film, and magnetized in one direction through the exchange interaction. In this case, the magnetization of the first ferromagnetic film is rotated by the applied external magnetic field. The resistance of the spin-valve film structure is determined by the relative angle of the magnetization direction of the first ferromagnetic film for that of the second ferromagnetic film. The external magnetic field is detected by the sense current change corresponding to the resistance change.

The underfilm has a face centered cubic crystal structure, and is oriented in the (111) plane direction. Then, the distance between the adjacent (111) planes of the spin-valve film structure except the antiferromagnetic film is within 0.2050–0.2064 nm. As a result, the spin-valve film structure can have a MR converting ratio of 10% or over.

The spin-valve film structure has the protective film on the antiferromagnetic film as well as a conventional one. The protective film may have the same crystal structure and be made of the same material as the underfilm.

The magnetoresistive sensor of the present invention may have another embodiment in which the antiferromagnetic film is positioned at the lower side of the spin-valve film structure. In this case, the one surface of the antiferromagnetic film is adjacent to the one surface of the underfilm. Then, the one surface of the second ferromagnetic film is adjacent to the other surface of the antiferromagnetic film, and thus, they are bonded each other with exchange interaction. The one surface of the conductive film is adjacent to the other surface of the second ferromagnetic film. The one surface of the first ferromagnetic film is adjacent to the other surface of the conductive film. The one surface of the protective film is adjacent to the other surface of the first ferromagnetic film. That is, the underfilm, the antiferromagnetic film, the second magnetic film, the conductive film, the first ferromagnetic film and the protective film are stacked in turn.

In this case, the underfilm also has a face centered cubic crystal structure, and is oriented in the (111) plane direction. Then, the distance between the adjacent (111) planes of the spin-valve film structure except the antiferromagnetic film is set within 0.2050–0.2064 nm. As a result, the spin-valve film structure can have a MR converting ratio of 10% or over.

A thin film magnetic head according to the present invention has a reading element composed of the above magnetoresistive sensor of the present invention, and thus, can exhibit the same operation and effect as the magnetoresistive sensor.

The thin film magnetic head may also have at least one writing element in addition to the above reading element. The writing element may be composed of a longitudinal recording inductive type electromagnetic converting element or a perpendicularly recording inductive type electromagnetic converting element. The longitudinal recording inductive type electromagnetic converting element has a first magnetic film, a second magnetic film and a gap film. The forefronts of the first and the second magnetic films are separated by the gap film, constituting a writing pole portion.

The perpendicular recording inductive type electromagnetic converting element has a first magnetic film and a second magnetic film. The second magnetic film includes a main magnetic pole to constitute a writing pole portion and a supplementary magnetic pole to magnetically combine the main magnetic pole and the first magnetic film.

This invention relates to a magnetic head device and a magnetic disk drive device having the above thin film magnetic head.

The other objects, constructions and advantages of the present invention will be described in detail, with reference to the attached drawings.

BRIEF DESCRIPTION OF THE DRAWINGS

For a better understanding of this invention, reference is made to the attached drawings, wherein.

DETAILED DESCRIPTION OF PREFERRED EMBODIMENTS

<Thin Film Magnetic Head in a First Embodiment>

Figure 1:
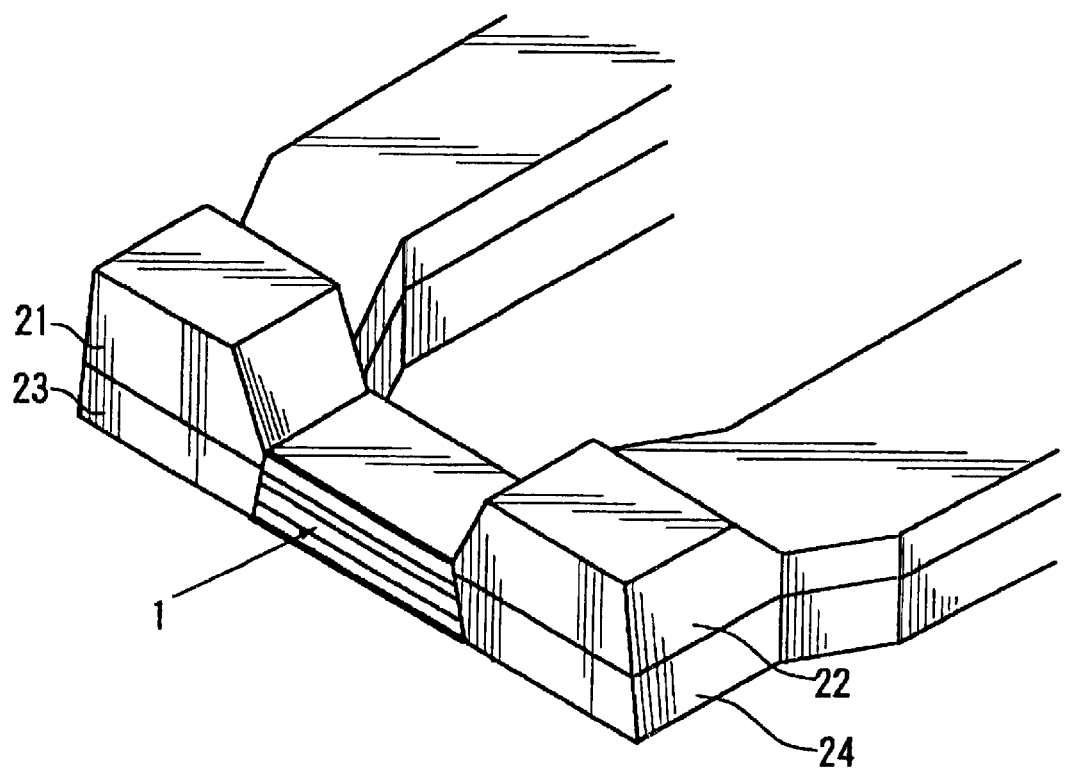
FIG. 1 is a perspective view of a magnetoresistive sensor with a spin-valve film structure according to the present invention.
Figure 2:
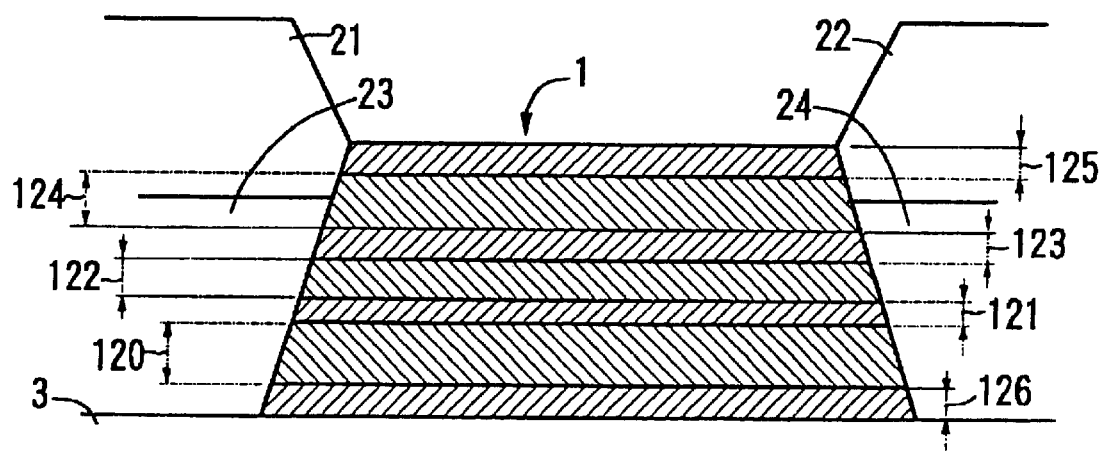
FIG. 2 is an enlarged cross sectional view of the magnetoresistive sensor in FIG. 1.
Figure 3:
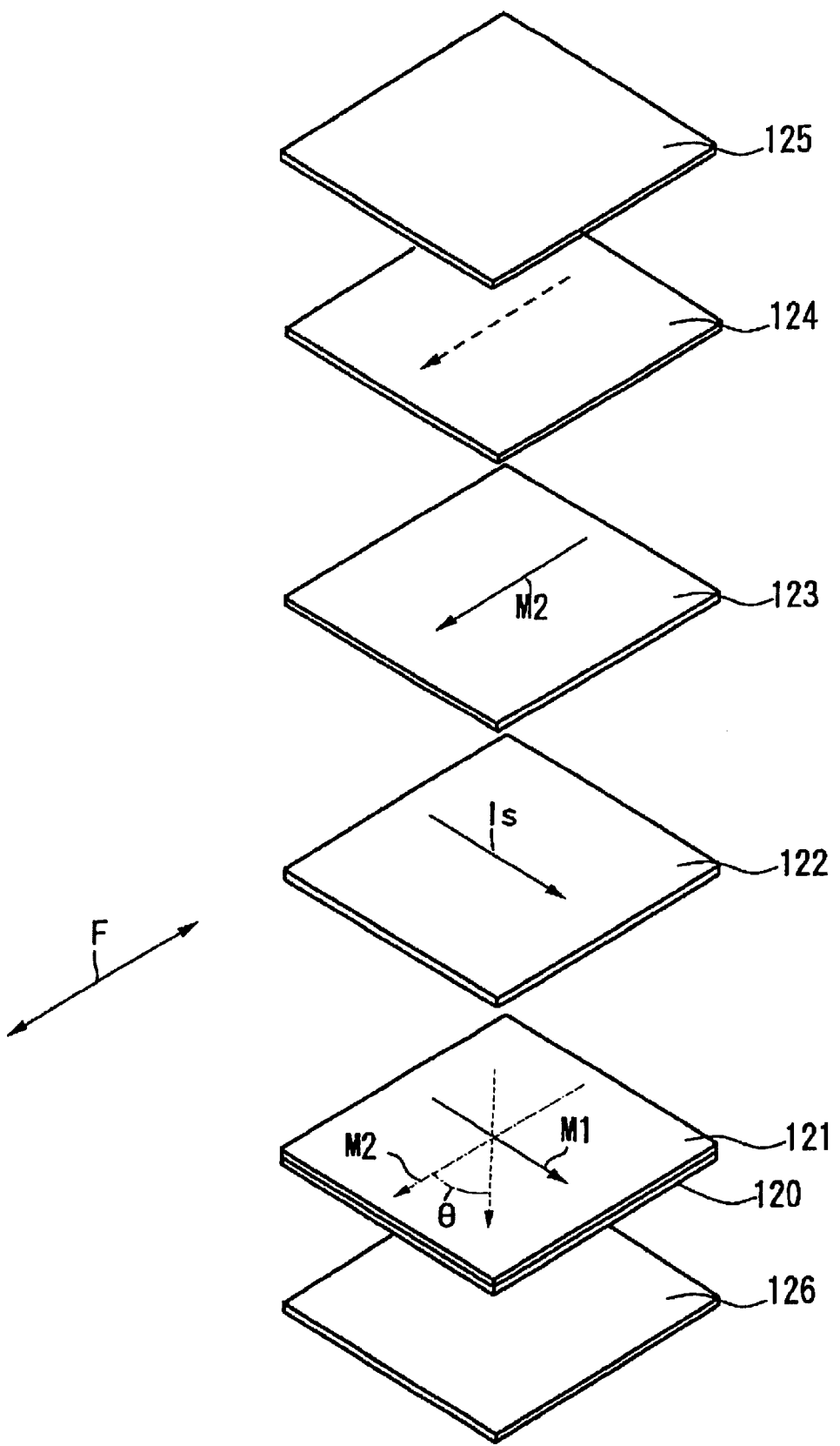
FIG. 3 is a disintegrated view of the spin-valve film structure in FIG. 1 for simplification.

FIG. 1 is a perspective view of a magnetoresistive sensor according to the present invention, and FIG. 2 is an enlarged cross sectional view of the magnetoresistive sensor in FIG. 1. FIG. 3 is a disintegrated view of the spin-valve film structure in FIGS. 1 and 2 for simplification. The depicted magnetoresistive sensor has a spin-valve film structure which includes an underfilm 126, a first ferromagnetic film 120; 121, a conductive film 122, a second ferromagnetic film 123, an antiferromagnetic film 124 and a protective film 125.

The underfilm 126 is stacked on a non-magnetic substrate 3. The first ferromagnetic film 120; 121 is adjacent to (stacked on) the underfilm 126. In this embodiment, the first ferromagnetic film 120;121 has two-layered structure composed of the two ferromagnetic films 120 and 121, but may have a single layered structure or a multi-layered structure composed of three or over magnetic films. The ferromagnetic film 120 may be composed of a NiFe film, and the ferromagnetic film 121 may be composed of a Co film or a CoFe film.

The conductive film 122, made of a Cu film or the like, is stacked on the first ferromagnetic film 121.

The second ferromagnetic film 123, made of a Co film, a CoFe film or the like, is stacked on the conductive film 122.

The antiferromagnetic film 124 is stacked on, and thus bonded to the second ferromagnetic film 123 with exchange interaction. In this case, the second ferromagnetic film 123 is magnetized in one direction shown by an arrow M2 (see, FIG. 3). The magnetization of the second ferromagnetic film 123 is pinned in the M2 direction.

The antiferromagnetic film 124 is made of various well known materials, concretely, a material mainly including PtMn, NiMn, RuRh, Mn, IrMn or the like. The antiferromagnetic film 124 may also include at least one element selected from the group consisting of Ru, Rh, Pd, Au, Ag, Fe and Cr. If the antiferromagnetic film 124 is composed of a PtMn film, the second ferromagnetic film 123 is preferably composed of a CoFe film. The protective film 125 is provided on the antiferromagnetic film 124.

On both side surface of the spin-valve film structure 1 are provided magnetic domain-controlling films 23 and 24 to apply a longitudinal magnetic bias to the first ferromagnetic film 120;121. The magnetic domain-controlling films 23 and 24 may be made of a magnet or an antiferromagnetic film to be bonded with exchange interaction to the first ferromagnetic film 120; 121. On the magnetic domain-controlling films 23 and 24 are formed leading conductive film 21 and 22 to flow a sense current Is in the conductive film 122 of the spin-valve film structure 1, respectively (see, FIG. 3).

If an external magnetic field F is applied to the spin-valve film structure 1, on condition that the second ferromagnetic film 123 is magnetized in the M2 direction by the bonding with exchange interaction to the antiferromagnetic film 124, the magnetization direction M1 of the first ferromagnetic film 120; 121 is rotated by an angle θ, depending on the intensity of the external magnetic field F. The resistance of the spin-valve film structure is determined by the angle θ of the magnetization direction Z1 of the first ferromagnetic film 120; 121 for the magnetization direction M2 of the second ferromagnetic film 123. The spinvalve film structure 1 has its maximum resistance when the magnetization direction M1 of the first ferromagnetic film 120;121 is opposite to the magnetization direction M2 of the second ferromagnetic film 123, and has its minimum resistance when the magnetization direction M1 is the same as the magnetization direction M2. The external magnetic field F is detected from the change of the sense current Is due to the above resistance change.

In the above spin-valve film structure, the underfilm 126 has a face centered cubic crystal structure, and is oriented in (111) plane direction. Then, the distance between the adjacent (111) planes of the spin-valve film structure except the antiferromagnetic film is set within 0.2050–0.2064 nm. Therefore, the spin-valve film structure can have a MR converting ratio of 10% or over. It is considered because the underfilm 126 adjacent to the ferromagnetic film 120 made of the NiFe film having a face centered cubic crystal structure is oriented in the (111) plane direction and has almost the same the distance between the adjacent (111) planes as the ferromagnetic film 120, and thus, the spin-valve film structure does not have fluctuation in lattice match at their respective boundaries.

The distance between the adjacent (111) planes of the spin-valve film structure except the antiferromagnetic film is preferably set within 0.2054–0.2063 nm, particularly within 0.2055–0.2062 nm.

Therefore, the underfilm 126 is preferably made of an alloy composed of at least one element selected from the group consisting of Ni, Fe, Co, and Cu and at least one element selected from the group consisting of Cr, Al, Mn, Ir, Mo and V.

The protective film 125, formed on the antiferromagnetic film 124, may have the same crystal structure and be made of the same material as the underfilm 126.

This invention will be explained concretely on experimental data.

<Data 1>

A spin-valve film structure as shown in FIGS. 1 and 2 was fabricated on the condition of:

the underfilm; 5 nm thickness the first ferromagnetic film 120;121 the ferromagnetic film 120; 3 nm thickness NiFe film the ferromagnetic film 121; 2 nm thickness CoFe film the conductive film 122; 2.5 nm thickness Cu film the second ferromagnetic film 123; 3 nm thickness CoFe film the antiferromagnetic film 124; 30 nm thickness PtMn film the protective film 125; 5 nm thickness Ta film.

Then, plural magnetoresistive sensors were prepared on various materials and compositions of the underfilm 126 of the above spin-valve film structure, and were listed in Examples 1–17. For comparison, a magnetoresistive sensor having the underfilm 126 made of a Ta film was prepared, and listed in Comparative Example 1. The MR converting ratios of the magnetoresistive sensors in Examples 1–17 and Comparative Example 1 were measured, and the relations between the MR converting ratios and the material and compositions of the underfilm 126 were exhibited in Table 1.

TABLE 1

| Sample | Materials and compositions of the underfilm (at %) | MR converting ratio (%) |
|---|---|---|
| Comparative Example 1 | Ta | 7.5 |
| Example 1 | Ni(60)Cr(40) | 12.0 |
| Example 2 | Ni(60)Cu(40) | 11.8 |
| Example 3 | Ni(60)Cr(30)Cu(10) | 11.9 |
| Example 4 | Ni(60)Fe(5)Cr(35) | 12.0 |
| Example 5 | Ni(60)Cu(30)Ir(10) | 11.1 |
| Example 6 | Ni(60)Cu(35)Al(5) | 11.2 |
| Example 7 | Ni(60)Cu(35)V(5) | 11.7 |
| Example 8 | Ni(60)Cr(30)Mo(10) | 11.6 |
| Example 9 | Ni(60)Fe(5)Cr(25)Mn(10) | 11.3 |
| Example 10 | Co(55)Fe(5)Cr(40) | 12.0 |
| Example 11 | Co(55)Fe(5)Cu(40) | 11.8 |
| Example 12 | Co(55)Fe(5)Cu(30)Al(10) | 11.3 |
| Example 13 | Ni(50)Co(5)Fe(5)Cr(40) | 11.5 |
| Example 14 | Cu(70)Cr(30) | 12.3 |
| Example 15 | Cu(70)Cr(20)V(10) | 12.2 |
| Example 16 | Cu(60)Cr(20)Mo(10)Mn(10) | 11.5 |
| Example 17 | Cu(75)V(10)Al(15) | 11.8 |

As is apparent from Table 1, the magnetoresistive sensors shown in Examples 1–17 have large MR converting ratio of 11% or over. The magnetoresistive sensor shown in Example 5 has a minimum MR converting ratio of 11.1%, and the one shown in Example 14 has a maximum MR converting ratio of 12.3%. The magnetoresistive sensor shown in Comparative Example 1 has a MR converting ratio of only 7.5%, so that it is clear that the magnetoresistive sensors shown in Examples 1–17 have excellent MR converting ratios in comparison with the one shown in Comparative Example 1.

Figure 4:
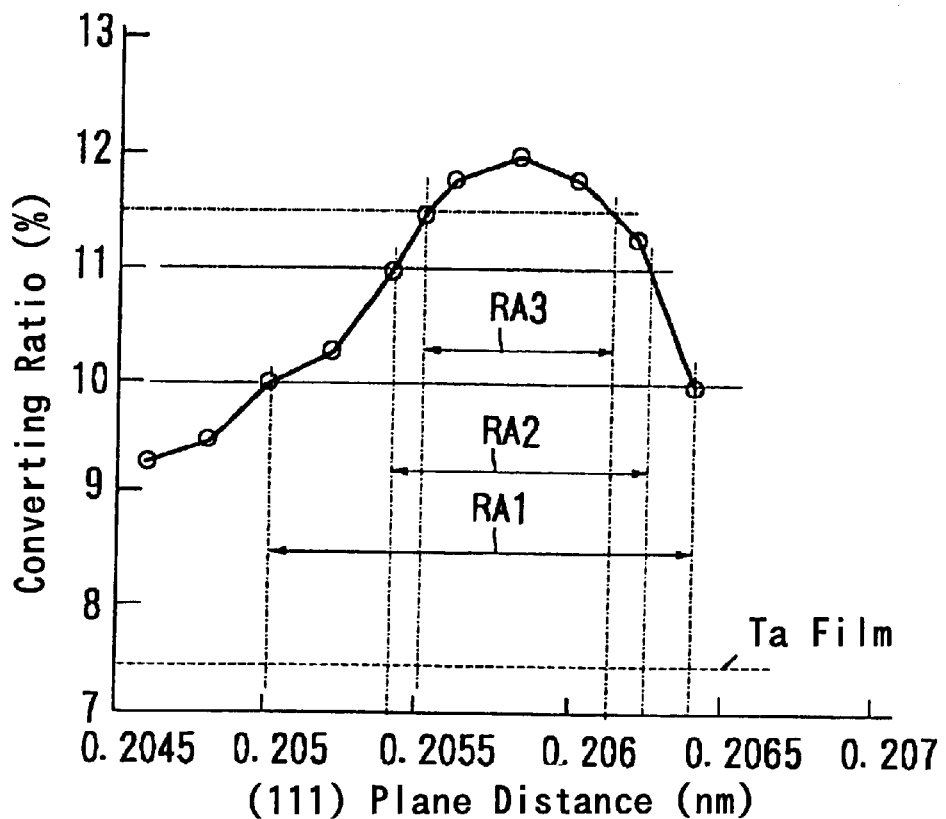
FIG. 4 is a graph showing the relation between the (111) plane distance and the MR converting ratio (%) of the magnetoresistive sensor of the present invention.

FIG. 4 is a graph showing the relation between the (111) plane distance of the spin-valve film structure except the antiferromagnetic film and the MR converting ratio (%) of the magnetoresistive sensor. The (111) plane distance was varied by the component and composition of the underfilm 126 made of an alloy composed of at least one element selected from the group consisting of Ni, Fe, Co and Cu and at least one element selected from the group consisting of Cr, Al, Mn, Ir, Mo and V. Moreover, the (111) plane distance was measured by X-ray diffraction using Cu—K α rays.

As shown in FIG. 4, a large MR converting ratio of 10% or over can be realized, on condition that the (111) plane distance is set within a range RA1 of 0.205–0.2064 nm. Moreover, a large MR converting ratio of 11% or over can be realized, on condition that the (111)plane distance is set within a range RA2 of 0.2054–0.2063 nm. The (111) plane distances of the spin-valve film structures except their respective antiferromagnetic films in the magnetoresistive sensors shown in Examples 1–17 are set within the ranges RA1 and RA2.

Moreover, a large MR converting ratio of 11.5% or over can be realized, on condition that the (111) plane distance is set within a range RA3 of 0.2055–0.2062 nm. The plane distances of the spin-valve film structures except their respective antiferromagnetic films in the magnetoresistive sensors shown in Examples 1–4, 7, 8, 10, 11, 13–17 are set within the range RA3.

As a result, it is figured out that the (111) plane distance is preferably set within the range RA2 of 0.2054–0.2063 nm, particularly the range RA3 of 0.2055–0.2062 nm. The MR converting ratio, almost 7.5%, of the magnetoresistive sensor having the underfiln made of the Ta film is designated by a broken line in FIG. 4.

Figure 5:
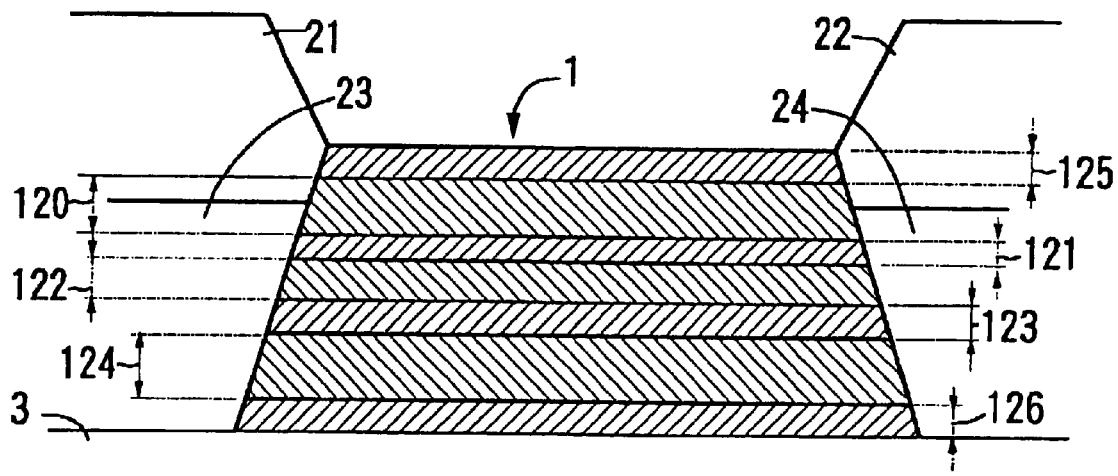
FIG. 5 is an enlarged cross sectional view showing another magnetoresistive sensor according to the present invention.

FIG. 5 is an enlarged cross sectional view showing another magnetoresistive sensor according to the present invention. In this embodiment, the antiferromagnetic film 124 is positioned at the lower side of the spin-valve film structure 1. Concretely, the antiferromagnetic film 124 is formed on the underfilm 126, and thus, one surface of the antiferromagnetic film 124 is adjacent to one surface of the underfilm 126. The second ferromagnetic film 123 is formed on and is bonded with exchange interaction to the antiferromagnetic film 124 at their boundaries. The conductive film 122 is formed on the second ferromagnetic film 123, and thus, one surface of the conductive film 122 is adjacent to the other surface of the second ferromagnetic film 123. The ferromagnetic film 120 is formed on the conductive film 122, and thus, one surface of the ferromagnetic film 120 is adjacent to the other surface of the conductive film 122. The ferromagnetic film 121 is so formed that one surface of the film 121 can be adjacent to the other surface of the ferromagnetic film 120, and the protective film 125 is so formed that one surface of the film 125 can be adjacent to the other surface of the ferromagnetic film 121.

In this embodiment, the underfilm 126 adjacent to the anti-ferromagnetic film 124 has a face centered cubic crystal structure, and is oriented in the (111) plane direction. Then, the distance between the adjacent (111) planes of the spin-valve film structure except the antiferromagnetic film 124 is set within 0.2050–0.2064 nm. As a result, a MR converting ratio can be realized. As mentioned above, the distance between the adjacent (111) planes is preferably set within 0.2054–0.2063 nm, particularly 0.2055–0.2062 nm, and the underfilm is preferably made of an alloy composed of at least one element selected from the group consisting of Ni, Fe, Co and Cu and at least one element selected from the group consisting of Cr, Al, Mn, Ir, Mo and V.

This embodiment will be explained concretely on experimental data.

<Data 2>

A spin-valve film structure as shown in FIG. 5 was fabricated on the condition of:

the underfilm; 5 nm thickness the first ferromagnetic film 120;121 the ferromagnetic film 120; 3 nm thickness NiFe film the ferromagnetic film 121; 2 nm thickness CoFe film the conductive film 122; 2.5 nm thickness Cu film the second ferromagnetic film 123; 3 nm thickness CoFe film the antiferromagnetic film 124; 30 nm thickness PtMn film the protective film 125; 5 nm thickness Ta film.

Then, plural magnetoresistive sensors were prepared on various materials and compositions of the underfilm 126 of the above spin-valve film structure, and were listed in Examples 18–34. For comparison, a magnetoresistive sensor having the underfilm 126 made of a Ta film was prepared, and listed in Comparative Example 2. The MR converting ratios of the magnetoresistive sensors in Examples 18–34 and Comparative Example 2 were measured, and the relations between the MR converting ratios and the material and compositions of the underfilm 126 were exhibited in Table 2.

TABLE 2

| Sample | Materials and compositions of the underfilm (at %) | MR converting ratio (%) |
| --- | --- | --- |
| Comparative Example 2 | Ta | 7.6 |
| Example 18 | Ni(60)Cr(40) | 11.8 |
| Example 19 | Ni(60)Cu(40) | 11.7 |

TABLE 2-continued

| Sample | Materials and compositions of the underfilm (at %) | MR converting ratio (%) |
| --- | --- | --- |
| Example 20 | Ni(60)Cr(30)Cu(10) | 11.8 |
| Example 21 | Ni(60)Fe(5)Cr(35) | 11.9 |
| Example 22 | Ni(60)Cu(30)Ir(10) | 11.2 |
| Example 23 | Ni(60)Cu(35)Al(5) | 11.3 |
| Example 24 | Ni(60)Cu(35)V(5) | 11.5 |
| Example 25 | Ni(60)Cr(30)Mo(10) | 11.5 |
| Example 26 | Ni(60)Fe(5)Cr(25)Mn(10) | 11.2 |
| Example 27 | Co(55)Fe(5)Cr(40) | 11.8 |
| Example 28 | Co(55)Fe(5)Cu(40) | 11.5 |
| Example 29 | Co(55)Fe(5)Cu(30)Al(10) | 11.2 |
| Example 30 | Ni(50)Co(5)Fe(5)Cr(40) | 11.2 |
| Example 31 | Cu(70)Cr(30) | 12.0 |
| Example 32 | Cu(70)Cr(20)V(10) | 12.0 |
| Example 33 | Cu(60)Cr(20)Mo(10)Mn(10) | 11.2 |
| Example 34 | Cu(75)V(10)Mo(10)Al(5) | 11.3 |

As is apparent from Table 2, the magnetoresistive sensors shown in Examples 18–34 have large MR converting ratio of 11% or over. The magnetoresistive sensors shown in Examples 22, 26, 29, 30 and 33 have a minimum MR converting ratio of 11.2%, and the ones shown in Examples 31 and 32 have a maximum MR converting ratio of 12.0%. The magnetoresistive sensor shown in Comparative Example 2 has a MR converting ratio of only 7.6%, so that it is clear that the magnetoresistive sensors shown in Examples 18–34 have excellent MR converting ratios in comparison with the one shown in Comparative Example 2.

Figure 6:
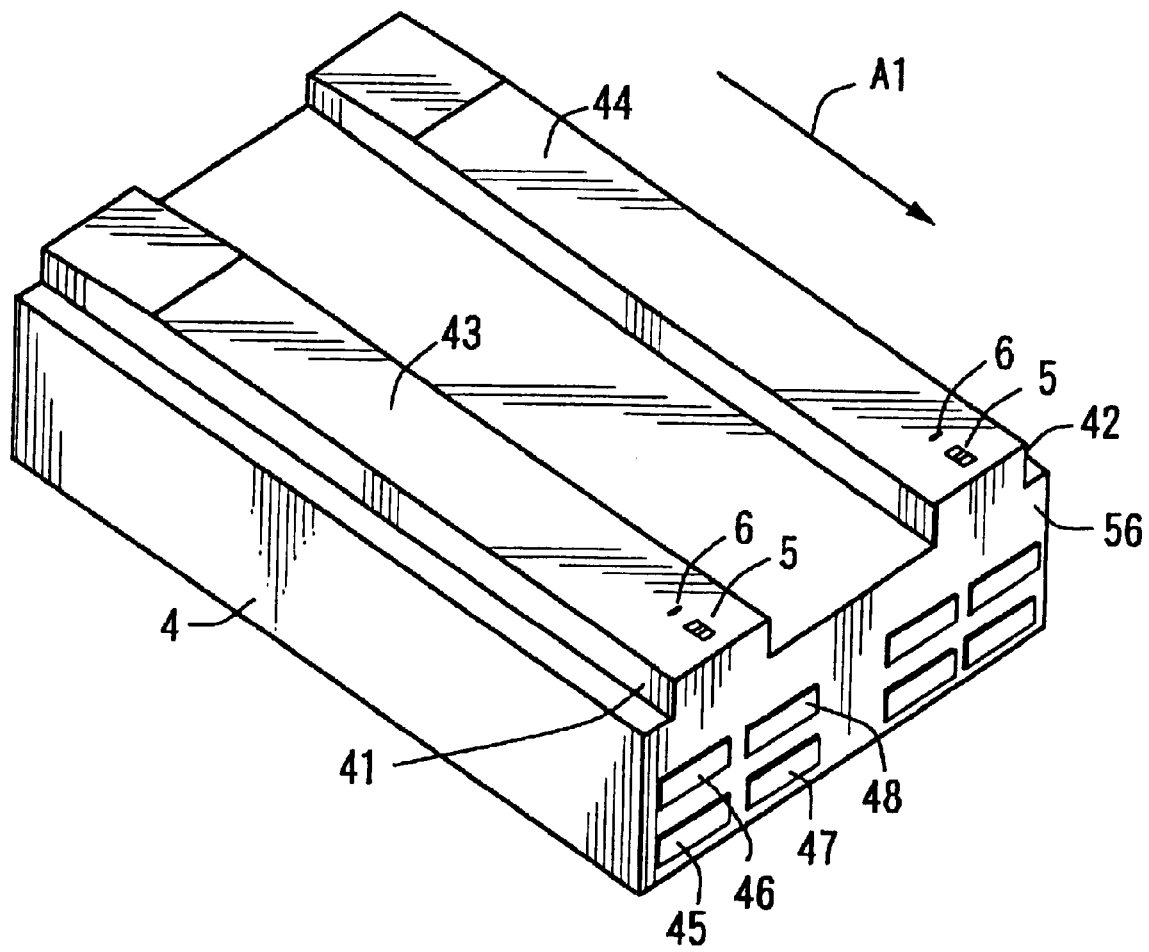
FIG. 6 is a perspective view showing a thin film magnetic head with a reading element composed of the magnetoresistive sensor of the present invention.
Figure 7:
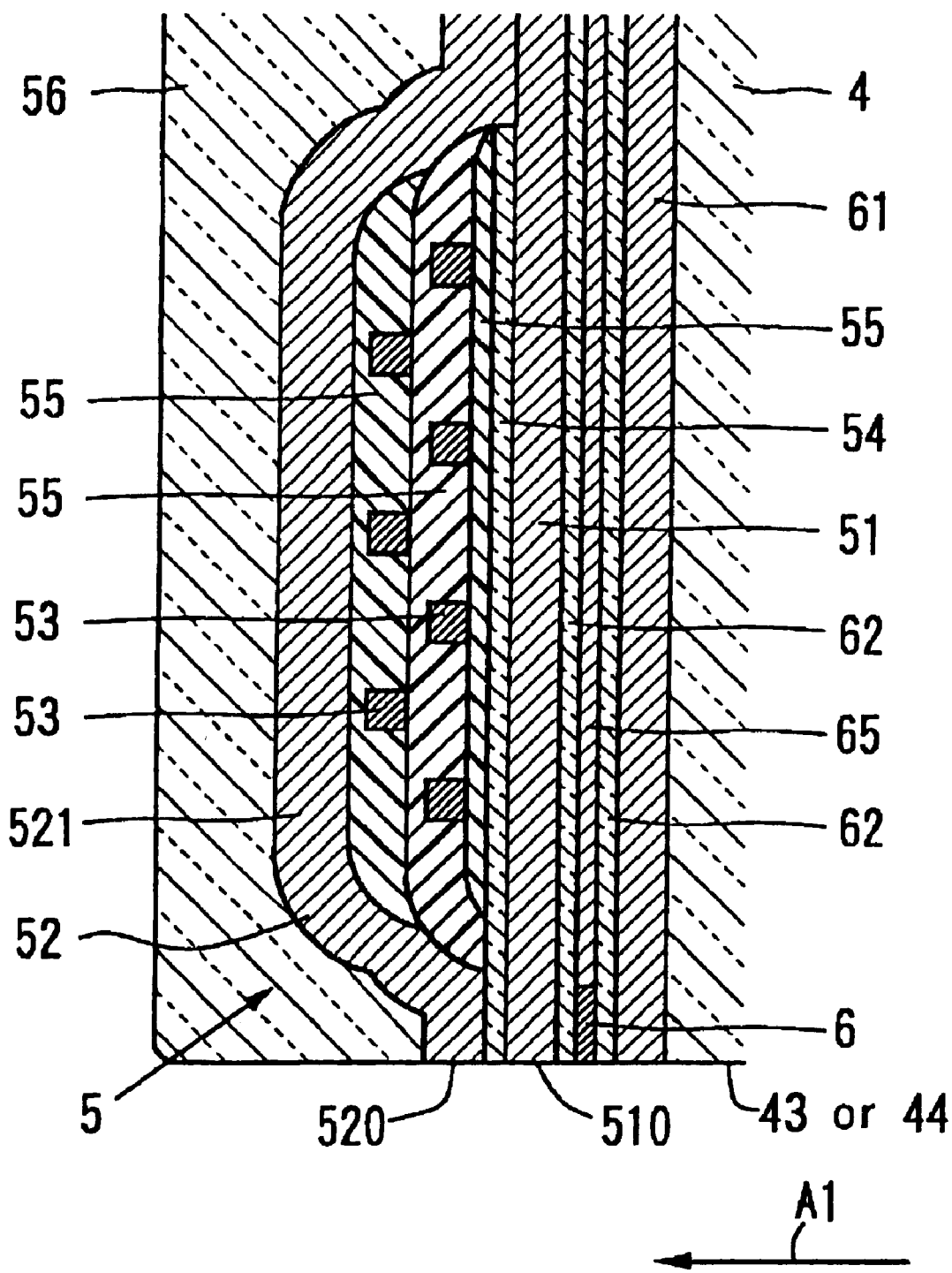
FIG. 7 is an enlarged cross sectional view of the thin film magnetic head in FIG. 6.

FIG. 6 is a perspective view showing a longitudinal recording thin film magnetic head with the above magnetoresistive sensor as a reading element and an inductive type magnetoresistive sensor as a writing element, and FIG. 7 is an enlarged cross sectional view of the thin film magnetic head shown in FIG. 6. The depicted thin film magnetic head has, on a slider 4, a reading element 6 composed of the magnetoresistive sensor of the present invention and a writing element 5 composed of the inductive type magnetoresistive converting element. An arrow A1 designates a medium-running direction. In this figure, the sizes of some parts are exaggerated, and different from the real ones.

The slider 4 has rails 41 and 42 on its opposing surface to a magnetic recording medium, and the surfaces of the rails 41 and 42 are employed as air bearing surfaces (hereinafter, often called as "ABS"s) 43 and 44. The slider 41 does not always have the two rails 41 and 42, and may have one to three rail part. Moreover, the slider may have a flat surface having no rail. For improving its floating characteristic, the opposing surface of the slider may have various geometrical shapes. This invention can be applied for any types of slider. The slider 41 may have protective films, made of DLC or the like, having a thickness of 8–10 nm on the rails. In this case, the surfaces of the protective films correspond to the ABSs. The slider 41 is a ceramic structural body composed of a substrate 410 made of $Al_2O_3$—TiC, etc. and an inorganic insulating film 420 made of $Al_2O_3$, $SiO_2$ etc. on the substrate 410.

The writing element 5 and the reading element 6 are provided in the trailing edge TR side of either or both of rails 41 and 42. The edge portions of the writing element 5 and the reading element 6 are exposed to the ABSs 43 and 44 for electromagnetic conversion. On the side surfaces in the trailing edge TR are provided pull-out electrodes 45 and 46 connected to the writing element 5 and pull-put electrodes 47 and 48 connected to the reading element 6.

The writing element 5 has a first magnetic film 51 doubling as a second shielding film for the reading element 6, a second magnetic film 52, a coil film 53, a gap film 54 made of alumina or the like, an insulating film 55 and a protective film 56. The second shielding film may be made of another magnetic film.

The forefronts 511 and 521 of the first magnetic film 51 and the second magnetic film 52 are opposed each other via the thin gap film 54, and constitute a pole portion of the thin film magnetic head for writing. The first and second magnetic films 51 and 52 may be composed of a magnetic single layer or a magnetic multilayer for improving the properties of the pole portion. In view of narrowing the track width and developing the recording performance, various modification has been made for the pole portion structure. This invention can be applied for any pole portion structures. The gap film 54 is composed of a non-magnetic metal film or an inorganic insulating film such as alumina.

The second magnetic film 52 is risen up at a given angle on the gap film 54 in the pole portion side. The rising angle is called as an "Apex angle". Moreover, the distance between the forefront of the pole portion and the rising point is called as a "throat height".

The second magnetic film 52 is extended backward from the ABSs 53 and 54 with keeping a given inner gap for the first magnetic film 51, and joined with the first magnetic film 51 at a backside joining portion 59. As a result, a thin film magnetic circuit is completed with the first and the second magnetic films 51 and 52, and the gap film 54.

The coil film 53 is sandwiched with the first and second magnetic films 51 and 52, and whirled around the backside joining portion 29. Both ends of the coil film 53 are connected to the pull-out electrodes 45 and 46 (see, FIG. 6). The winding number and layer number of the coil film 53 are not restricted.

The insulating film 55 may be composed of an organic insulating resin film or a ceramic film such as an $Al_2O_3$ film or a $SiO_2$ film. The ceramic insulating film can reduce its maximum protrusion volume than the organic insulating film because it has a smaller heat expansion.

The coil film 53 is embedded in the insulating film 55, which is filled in the inner gap between the first and the second magnetic films 51 and 52 and on which the second magnetic film 52 is provided. Therefore, the coil film 53 is electrically insulated from the first and the second magnetic films 21 and 22.

Then, the writing element 5 is covered with a protective film 56 made of an inorganic insulating material such as $Al_2O_3$ or $SiO_2$ entirely.

The reading element 6 is composed of a magnetoresistive sensor according to the present invention. The reading element 6 is positioned in an insulating film 62, made of alumina or the like, between a first shielding film 61 and the first magnetic film 51 doubling as the second shielding film, and connected to the pull-out electrodes 47 and 48 (see, FIG. 6).

Figure 8:
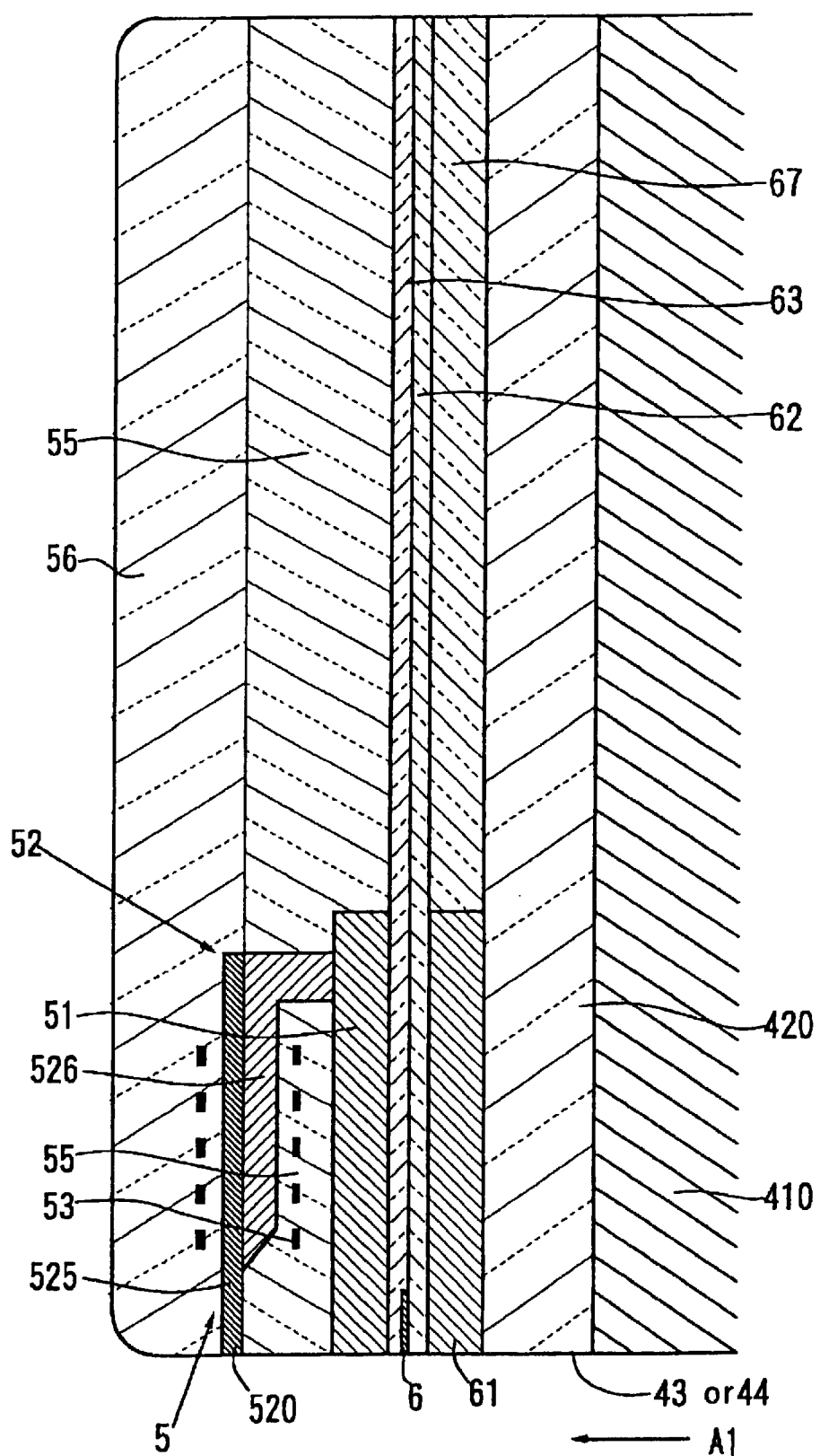
FIG. 8 is an enlarged cross sectional view showing a perpendicular recording thin film magnetic head according to the present invention.

FIG. 8 is an enlarged cross sectional view showing a perpendicular recording thin film magnetic head. In the perpendicular recording thin film magnetic head, the second magnetic film 52 includes a main magnetic pole 525 and a supplementary magnetic pole 526. The main magnetic pole 525 constitutes a perpendicular writing pole portion, and the supplementary magnetic pole 526 combine the main magnetic pole 525 and the first magnetic film 51 magnetically. The first magnetic film 51 constitutes a returning magnetic path for the magnetic flux generated from the main magnetic pole 525. The coil film 53 is whirled around the main magnetic pole 525 and the supplementary magnetic pole 526. The other parts of the perpendicular recording thin film magnetic head are similar to the ones of the longitudinal recording thin film magnetic head shown in FIG. 7, and thus, detail explanation is not given. The perpendicular recording thin film magnetic head can realize an extremely high density recording because it magnetizes a magnetic recording film of a magnetic disk in a direction perpendicular to the surface thereof.

Figure 9:
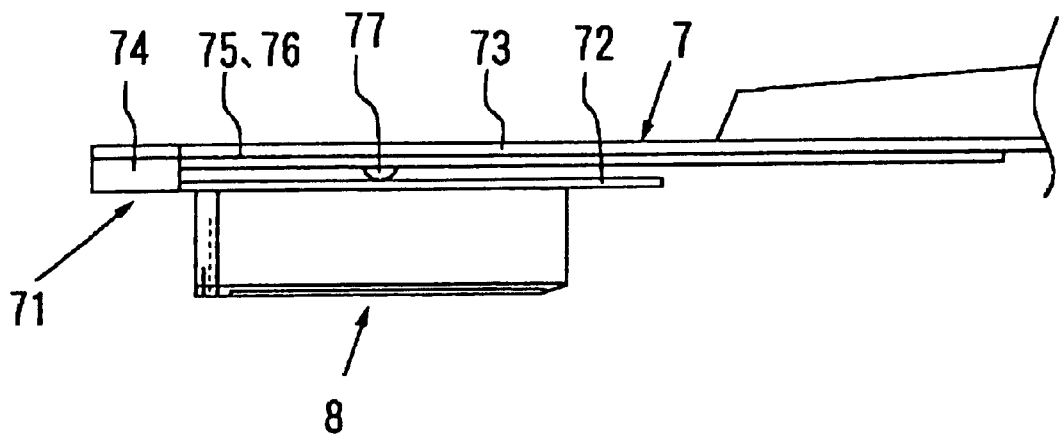
FIG. 9 is an elevational view showing a part of a magnetic head device according to the present invention.
Figure 10:
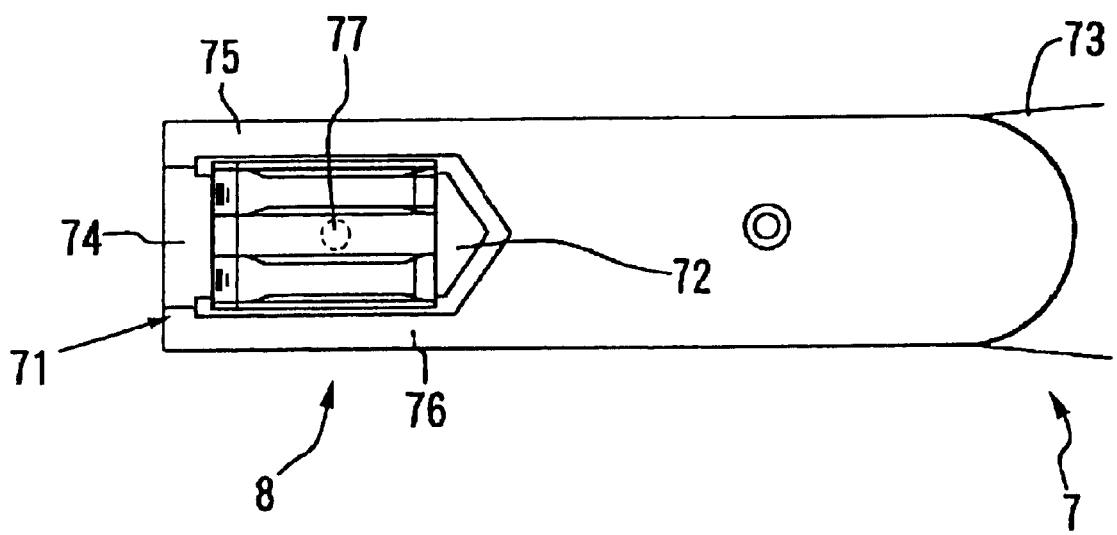
FIG. 10 is a bottom plan view of the magnetic head device in FIG. 9.

FIG. 9 is an elevational view showing a part of a magnetic head device according to the present invention, and FIG. 10 is a bottom plan view of the magnetic head device in FIG. 9. A depicted magnetic head device includes a thin film magnetic head 8 and a head supporting device 7. The thin film head 8 is similar to the one shown in FIGS. 7 and 8 according to the present invention.

The head supporting device 7 supports the thin film magnetic head 8 at the under surface of a flexible member 71 made of a metallic plate attached on the free edge thereof in the long direction of a supporting member 73 made of a metallic plate.

The flexible member 71 has two outer frames 75 and 76 extending along the long direction of the supporting member 73, a side frame 74 to join the outer frames 75 and 76 at the edge thereof, and a tongue-shaped member 72, of which one end is a free edge, extending along the outer frames 75 and 76 from the center of the side frame.

On the center of the tongue shaped member 72 is positioned a hemispherical loading protrusion 77, bulging on the supporting member 73, to apply load to the tongue-shaped member 72.

The thin film magnetic head 8 is attached on the under surface of the tongue-shaped member 72 so that it can have its air outflow edge along the side frame 74. In addition to the above head supporting device 7, various device may be available.

Figure 11:
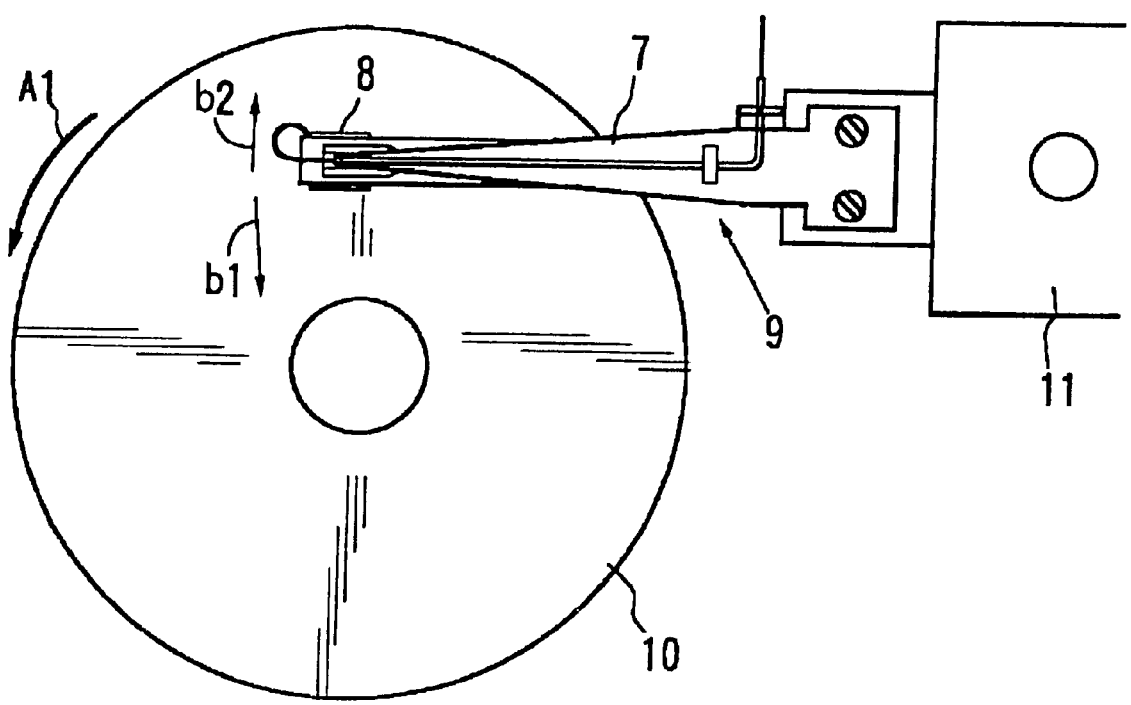
FIG. 11 is a schematic view showing a magnetic recording/producing device as a magnetic disk drive device according to the present invention.

FIG. 11 is a schematic view showing a magnetic recording/producing device as a magnetic disk drive device according to the present invention. A magnetic recording/producing drive device depicted in FIG. 11 includes a magnetic head device 9 similar to the one shown in FIGS. 9 and 10 and a magnetic disk 10. The magnetic head device 9 is driven by a position determining device 11 which supports one end of the device 9. The thin film magnetic head 8 of the magnetic head device 9 is supported by the head supporting device 5 so that it can face the magnetic recording surface of the magnetic disk 10.

When the magnetic disk 10 is rotated in an A1 direction by a not shown driving device, the thin film magnetic head 8 is floated from on the magnetic disk 10 by a minute distance. The magnetic recording drive device shown in FIG. 11 is called as a "rotary-actuator driving system". In this case, the thin film magnetic head 8 attached to the forefront of the head supporting device 7 is driven in a radial direction b1 or b2 of the magnetic disk 10 and positioned on a given track by the position determining device 11 to rotate the head supporting device 7. Then, the magnetic recording and reading are carried out on the given track by the writing element 5 and the reading element 6 having the above spin-valve film structure, respectively.

This invention has been described in detail with reference to the above preferred concrete embodiments, but it is obvious for the ordinary person skilled in the art that various modifications can be made in its configuration and detail without departing from the scope of this invention.

As mentioned above, this invention can provide the magnetoresistive sensor having a MR converting ratio of 10% or over, the thin film magnetic head, the magnetic head device and the magnetic disk drive device which have the magnetoresistive sensor.

What is claimed is:

1. A magnetoresistive sensor comprising a spin-valve film structure including an underfilm, a first ferromagnetic film, a conductive film, a second ferromagnetic film, an antiferromagnetic film and a protective film, one surface of the first ferromagnetic film being adjacent to one surface of the underfilm, one surface of the conductive film being adjacent to the other surface of the first ferromagnetic film, one surface of the second ferromagnetic film being adjacent to the other surface of the conductive film, one surface of the antiferromagnetic film being adjacent to the other surface of the second ferromagnetic film, and thus, the antiferromagnetic film being bonded with exchange interaction to the second ferromagnetic film, one surface of the protective film being adjacent to the other surface of the antiferromagnetic film, the underfilm having a face centered cubic crystal structure, and being oriented in the (111) plane direction, and the distance between the adjacent (111) planes of the spin-valve film structure except the antiferromagnetic film being set within 0.2050–0.2064 nm.

2. A magnetoresistive sensor as defined in claim 1, wherein the protective film has a face centered crystal structure and is oriented in the (111) plane direction.

3. A magnetoresistive sensor as defined in claim 1, wherein the distance between the adjacent (111) planes of the spin-valve film structure except the antiferromagnetic film is set within 0.2054–0.2063 nm.

4. A magnetoresistive sensor as defined in claim 3, wherein the distance between the adjacent (111) planes of the spin-valve film structure except the antiferromagnetic film is set within 0.2055–0.2062 nm.

5. A magnetoresistive sensor as defined in claim 1, wherein at least one of the underfilm and the protective film has a non-magnetic property or a Curie temperature not more than the driving temperature of the magnetoresistive sensor, and is made of an alloy composed of at least one element selected from the group consisting of Ni, Fe, Co and Cu and at least one element selected from the group consisting of Cr, Al, Mn, Ir, Mo and V.

6. A magnetoresistive sensor as defined in claim 1, wherein the first ferromagnetic film includes a NiFe film adjacent to the underfilm.

7. A magnetoresistive sensor as defined in claim 6, wherein the first ferromagnetic film includes a CoFe film adjacent to the NiFe film.

8. A magnetoresistive sensor as defined in claim 1, wherein the antiferromagnetic film is composed of a PtMn film.

9. A magnetoresistive sensor as defined in claim 1, wherein the second ferromagnetic film is composed of a CoFe film.

10. A magnetoresistive sensor comprising a spin-valve film structure including an underfilm, an antiferromagnetic film, a second ferromagnetic film, a conductive film, a first ferromagnetic film and a protective film, one surface of the antiferromagnetic film being adjacent to one surface of the underfilm, one surface of the second ferromagnetic film being adjacent to the other surface of the antiferromagnetic film, and thus, the second ferromagnetic film being bonded with exchange interaction to the second ferromagnetic film, one surface of the conductive film being adjacent to the other surface of the second ferromagnetic film, one surface of the first ferromagnetic film being adjacent to the other surface of the conductive film, one surface of the protective film being adjacent to the other surface of the first ferromagnetic film, the underfilm having a face centered cubic crystal structure, and being oriented in the (111) plane direction, and the distance between the adjacent (111) planes of the spin-valve film structure except the antiferromagnetic film being set within 0.2050–0.2064 nm.

11. A magnetoresistive sensor as defined in claim 10, wherein the protective film has a face centered crystal structure and is oriented in the (111) plane direction.

12. A magnetoresistive sensor as defined in claim 10, wherein the distance between the adjacent (111) planes of the spin-valve film structure except the antiferromagnetic film is set within 0.2054–0.2063 nm.

13. A magnetoresistive sensor as defined in claim 12, wherein the distance between the adjacent (111) planes of the spin-valve film structure except the antiferromagnetic film is set within 0.2055–0.2062 nm.

14. A magnetoresistive sensor as defined in claim 10, wherein at least one of the underfilm and the protective film has a non-magnetic property or a Curie temperature not more than the driving temperature of the magnetoresistive sensor, and is made of an alloy composed of at least one element selected from the group consisting of Ni, Fe, Co and Cu and at least one element selected from the group consisting of Cr, Al, Mn, Ir, Mo and V.

15. A magnetoresistive sensor as defined in claim 10, wherein the first ferromagnetic film includes a NiFe film adjacent to the underfilm.

16. A magnetoresistive sensor as defined in claim 15, wherein the first ferromagnetic film includes a CoFe film adjacent to the NiFe film.

17. A magnetoresistive sensor as defined in claim 10, wherein the antiferromagnetic film is composed of a PtMn film.

18. A magnetoresistive sensor as defined in claim 10, wherein the second ferromagnetic film is composed of a CoFe film.

19. A thin film magnetic head comprising at least one reading element composed of a magnetoresistive sensor as defined in claim 1.

20. A thin film magnetic head further comprising at least one writing element.

21. A thin film magnetic head as defined in claim 19, wherein the writing element is composed of an inductive type electromagnetic converting element including a first magnetic film, a second magnetic film and a gap film, the forefronts of the first and the second magnetic films being separated by the gap film, and thus, constituting a writing pole portion.

22. A thin film magnetic head as defined in claim 19, wherein the writing element is composed of an inductive type electromagnetic converting element including a first magnetic film with a main magnetic pole and a supplementary magnetic pole and a second magnetic film, the main magnetic pole constituting a perpendicular writing pole portion, the supplementary magnetic pole magnetically combining the main magnetic pole and the first magnetic film.

23. A magnetic head device comprising a thin film magnetic head as defined in claim 19, and a head supporting device to support the thin film magnetic head.

24. A magnetic recording drive device comprising a magnetic head device as defined in claim 23 and a magnetic disk to be magnetically recorded and reproduced by the magnetic head device.

* * * * *